(12) United States Patent
Teh et al.

(10) Patent No.: US 8,866,287 B2
(45) Date of Patent: Oct. 21, 2014

(54) EMBEDDED STRUCTURES FOR PACKAGE-ON-PACKAGE ARCHITECTURE

(71) Applicant: Intel Corporation, Santa Clara, CA (US)

(72) Inventors: Weng Hong Teh, Phoenix, AZ (US); Vinodhkumar Raghunathan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/631,990

(22) Filed: Sep. 29, 2012

(65) Prior Publication Data

US 2014/0093999 A1    Apr. 3, 2014

(51) Int. Cl.
*H01L 23/12* (2006.01)

(52) U.S. Cl.
USPC ............... 257/700; 257/783; 257/E21.502

(58) Field of Classification Search
None
See application file for complete search history.

(56) References Cited

U.S. PATENT DOCUMENTS

| | | | |
|---|---|---|---|
| 8,633,551 B1 | 1/2014 | Teh et al. | |
| 2007/0056766 A1 | 3/2007 | Sunohara | |
| 2007/0074900 A1 | 4/2007 | Lee et al. | |
| 2010/0025082 A1 | 2/2010 | Sasaoka et al. | |
| 2011/0090657 A1 | 4/2011 | Yoshino et al. | |
| 2011/0156231 A1 | 6/2011 | Guzek | |
| 2011/0259630 A1 | 10/2011 | Park | |
| 2012/0326271 A1 | 12/2012 | Teh et al. | |
| 2013/0270715 A1 | 10/2013 | Malatkar et al. | |
| 2013/0277837 A1 | 10/2013 | Teh et al. | |
| 2013/0277865 A1 | 10/2013 | Teh et al. | |
| 2013/0284572 A1 | 10/2013 | Teh et al. | |
| 2014/0000377 A1 | 1/2014 | Lin et al. | |
| 2014/0001583 A1 | 1/2014 | Teh et al. | |

FOREIGN PATENT DOCUMENTS

KR    20070037939    4/2007

OTHER PUBLICATIONS

US Patent Publication No. 2007/0074900, dated Apr. 5, 2007, is an English language equivalent of KR20070037939, dated Apr. 9, 2007.
International Search Report and Written Opinion for International Application No. PCT/US2013/048783, dated Oct. 18, 2013, 12 pp. [77.269PCT (ISR & WO)].
Pending U.S. Appl. No. 13/995,924, filed Jun. 19, 2013, Invented by Teh et al.
Pending U.S. Appl. No. 13/976,356, filed Jun. 26, 2013, Invented by Teh et al.
Pending U.S. Appl. No. 13/618,003, filed Sep. 14, 2012, Invented by Ma et al.
Pending U.S. Appl. No. 13/631,205, filed Sep. 28, 2012, Invented by Teh et al.
Pending U.S. Appl. No. 13/624,288, filed Sep. 21, 2012, Invented by Teh et al.
Pending U.S. Appl. No. 13/630,500, filed Sep. 28, 2012, Invented by Raghunathan et al.
Pending U.S. Appl. No. 13/631,959, filed Sep. 29, 2012, Invented by Seneviratne et al.
Pending U.S. Appl. No. 13/631,982, filed Sep. 29, 2012, Invented by Nair et al.

*Primary Examiner* — Cheung Lee
(74) *Attorney, Agent, or Firm* — Konrad Raynes Davda & Victor LLP; Alan S. Raynes

(57) ABSTRACT

Electronic assemblies including substrates and their manufacture are described. One assembly includes a die embedded in a dielectric layer in a multilayer substrate, and a dielectric region embedded in the dielectric layer in the multilayer substrate. The multilayer substrate includes a die side and a land side, with the first dielectric region and the dielectric layer extending to the die side. A plurality of vias are positioned within the first dielectric region, the vias extending to pads on the die side. Other embodiments are described and claimed.

15 Claims, 7 Drawing Sheets

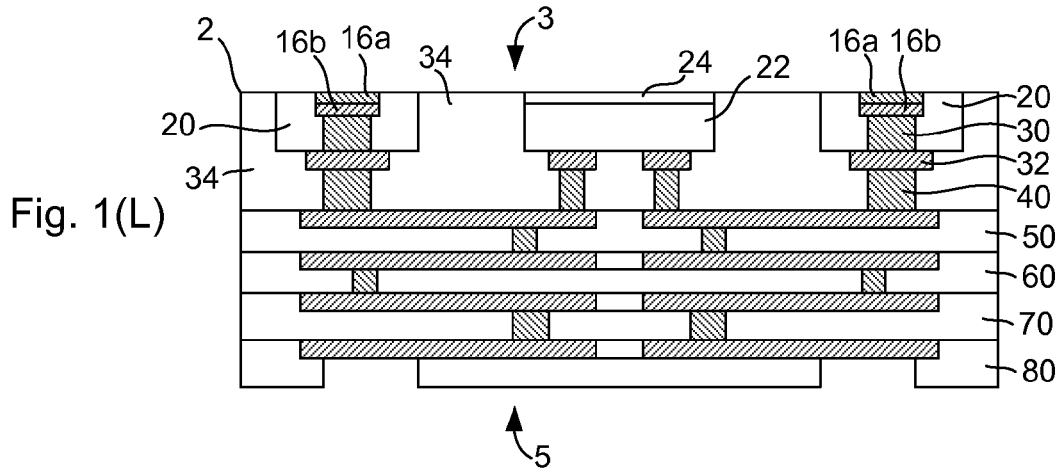
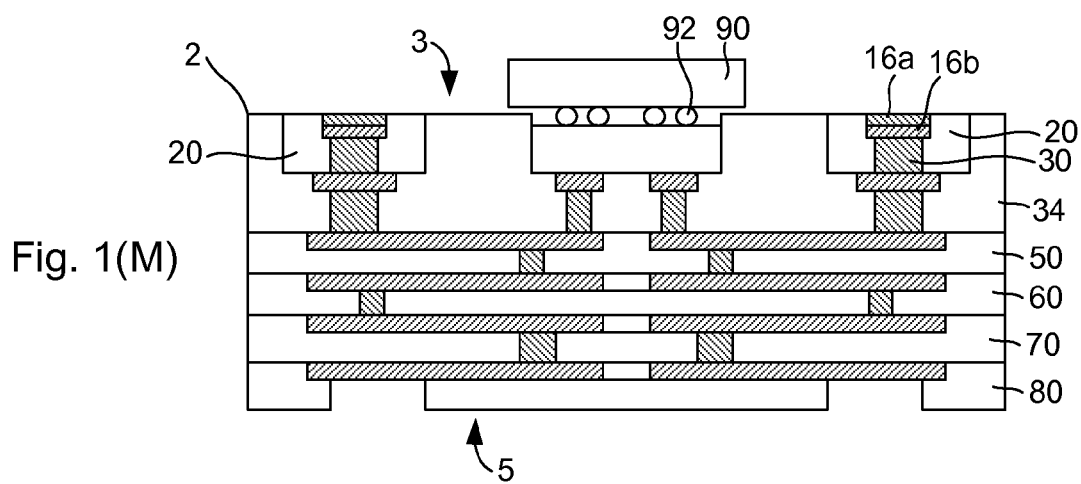
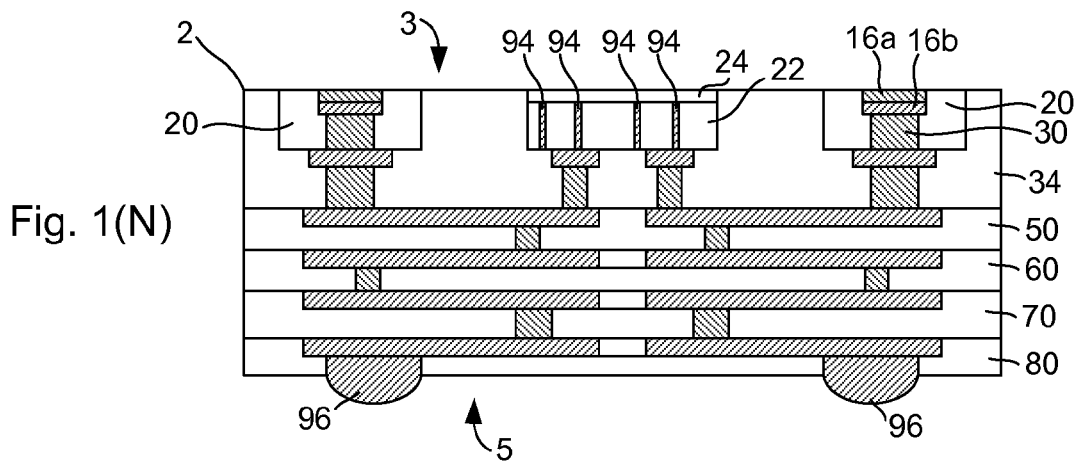

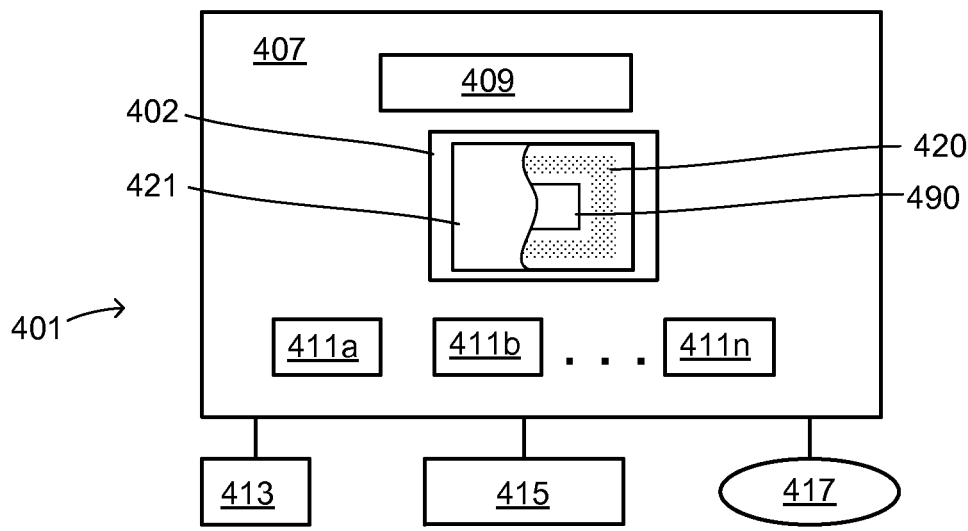

EMBEDDED STRUCTURES FOR PACKAGE-ON-PACKAGE ARCHITECTURE

RELATED ART

As electronic devices are made smaller and smaller, advances in packaging architecture include the mounting of one or more die structures to a package substrate, or mounting one package substrate to another package substrate in a package on package (POP) assembly. Such assemblies may be formed using a variety of package substrate structures. One type of package substrate structure is a bumpless build-up layer (BBUL) structure, which is a packaging technology that does not utilize solder bumps to attach a die to a package substrate. The die is positioned on a surface and layers of dielectric and electrically conducting material (e.g., metal) are built-up around the die.

BRIEF DESCRIPTION OF THE DRAWINGS

Embodiments are described by way of example, with reference to the accompanying drawings, which are not necessarily drawn to scale.

FIG. 5 illustrates an electronic system arrangement in which embodiments may find application.

DETAILED DESCRIPTION

Reference below will be made to the drawings wherein like structures may be provided with like reference designations. In order to show the structures of various embodiments most clearly, the drawings included herein include diagrammatic representations of electronic devices. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Certain embodiments relate to the formation of embedded die structures. Such embedded die structures have generally required high aspect ratio package-on-package (POP) vias. Certain embodiments form stacked POP vias to form an interconnection to the surface of the package substrate.

The stacked POP vias may be utilized when the embedded die has a thickness that requires the presence of large aspect ratio POP vias, for example, greater than about 1.5 to 1. For example, for an embedded die having a thickness of about 120 microns (μm), the POP via depth in certain embodiments should be about 160-200 μm deep. However, delamination and cracking have been observed when the POP via depth exceeds about 80-90 μm. In addition, it has proven difficult to form a completely plated (filled) POP via for such high aspect ratio POP vias. In the stacked POP via structure, several shorter POP vias, each having a smaller aspect ratio, are stacked on each other, to create a deeper POP via structure than can be more reliably formed. This may be carried out by forming embedded dielectric regions within a larger dielectric layer in the package structure.

Figure 1A:
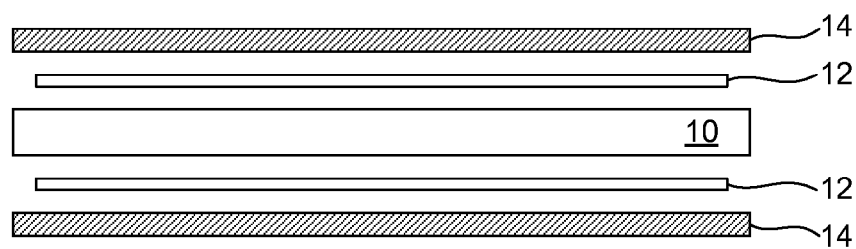
FIGS. 1(A)-1(N) illustrate views of processing operations for forming an assembly including an embedded die and POP vias, in accordance with certain embodiments.

FIGS. 1(A)-1(N) illustrate operations for forming an assembly including an embedded die in a coreless substrate, in accordance with certain embodiments. In certain embodiments, two identical embedded die assemblies may be formed in a back to back manner. This is accomplished by mating the assemblies together using an adhesive. For example, as illustrated in FIG. 1(A), a carrier structure includes a material such as a prepreg material 10 on which a metal layer such as a short copper (Cu) foil 12 is positioned on an upper portion thereof. To enable the back-to-back assembly formation, another metal layer such as a short Cu foil 12 is positioned on a lower portion of the prepreg material 10 as illustrated in FIG. 1. Identical assemblies are formed above and below the prepreg material 10, as illustrated in FIGS. 1(A)-1(K). For simplicity, the formation of the assembly above the prepreg material 10 in FIG. 1(A) will be discussed and referenced. A metal layer such as a long Cu foil 14 is coupled to the short Cu foil 12. The long Cu foil 14 may be a sacrificial layer that is removed during later processing. The illustrated assembly may be part of a larger panel of assemblies with a plurality of identical back-to-back structures. In certain embodiments thousands of assemblies may be formed from a single panel. assemblies may be formed as part of a large panel of back-to-back individual substrate assemblies. The panel may be formed so that the short Cu foil 12 does not extend all the way to the panel edge, while the long Cu foil 14 extends beyond the short Cu foil 12. At those end portions where the short Cu foil 12 is not present, the long Cu foil 12 is bonded to the prepreg 10 (for example, from epoxy in the prepreg material). This bond between the long Cu foil 14 and the prepreg 10 acts to hold the assembly together. When panel processing is complete, the end regions where the long Cu foil 14 is bonded to the prepreg 10 are cut. Along the rest of the length of the panel there is nothing holding the long Cu foil to the short Cu foil. The long Cu foil is then etched off the assembly in a later processing operation.

Figure 1B:

As illustrated in FIG. 1(B), package-on-package (POP) pads 16 are formed on the long Cu foil 14. Any suitable materials for the POP pads 16 may be used, including, but not limited to, a multilayer structure including a first layer 16a comprising gold (Au) and nickel (Ni) and a second layer 16b comprising Cu. The first layer 16a may constitute a surface finish layer that will be on a surface on which another component may be coupled, The POP pads 16 may be formed used any suitable process, including, but not limited to, deposition, masking, and etching operations.

Figure 1C:
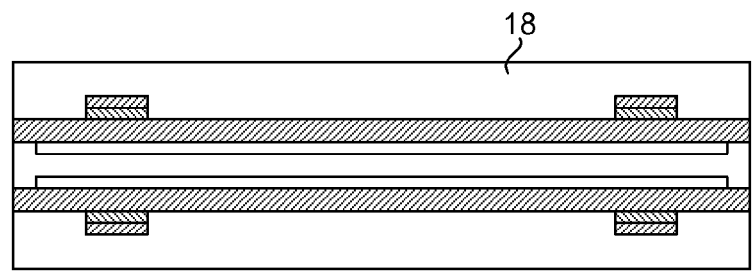
Figure 1D:
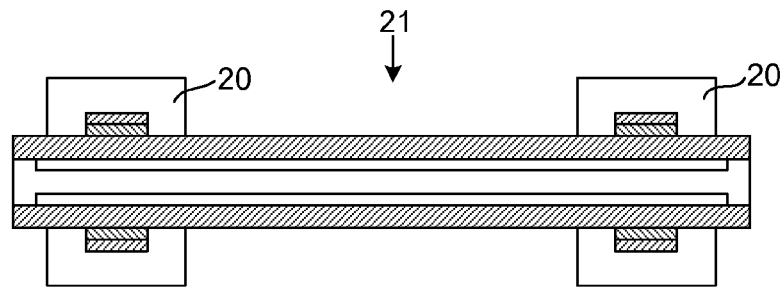

FIG. 1(C) illustrates the formation of a dielectric layer 18 on the long Cu foil 14 and on the POP pads 16. The dielectric layer 18 may be formed from any suitable dielectric material, including, but not limited to, polymeric materials. The dielectric layer 18 may be formed using a BBUL process with a material such as, for example, a polymer. One example of a suitable material is a polymeric epoxy film known as Aginomoto Build-up Film (ABF), available from Ajinomoto Fine-Techno Company, Inc. As illustrated in FIG. 1(D), the dielectric layer 18 may be patterned to form one or more dielectric regions 20 that cover the POP pads 16 and a cavity or opening 21 is formed between the dielectric regions 20. This may be performed using any suitable process, including, but not limited to, dry film resist (DFR) lithography followed by sandblasting and subsequent DFR removal. The dielectric regions 20 may in certain embodiments be a single dielectric region 20 that extends around part or all of the cavity 21. In other embodiments, the dielectric region 20 may include separate dielectric regions 20 spaced a distance apart from one another.

Figure 1E:
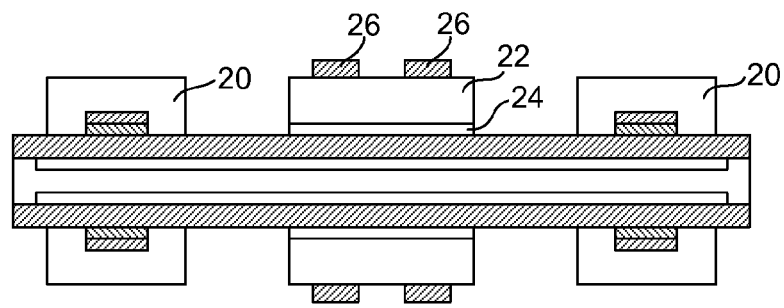

As illustrated in FIG. 1(E), a die 22 may then be mounted in the cavity 21 between the POP pads 16 on the long Cu foil 14. A variety of die structures may be utilized, including, but not limited to, silicon die structures with or without through-silicon vias (TSVs). A die bonding film 24 may be positioned between the die 22 and the long Cu foil 14. The die bonding film 24 may be any suitable material, including, but not limited to, a polymer adhesive. The die may include a plurality of die pads 26 on an upper surface thereof, as illustrated in FIG. 1(E). Though two pads 26 illustrated, any number may be present.

Figure 1F:
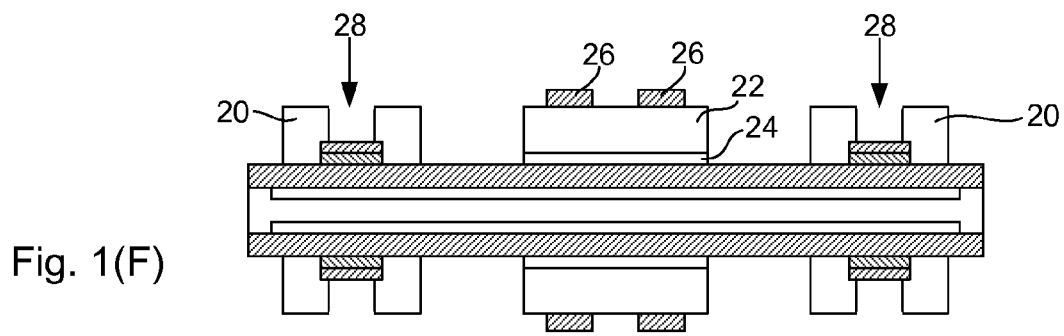

FIG. 1(F) illustrates the formation of POP via openings 28 through the dielectric regions 20 that extend to the POP pads 16. The openings 28 may be formed using any suitable method, including, but not limited to, laser drilling. In certain embodiments, the formation of the vias 28 may be carried out prior to the mounting of the die 22.

Figure 1G:
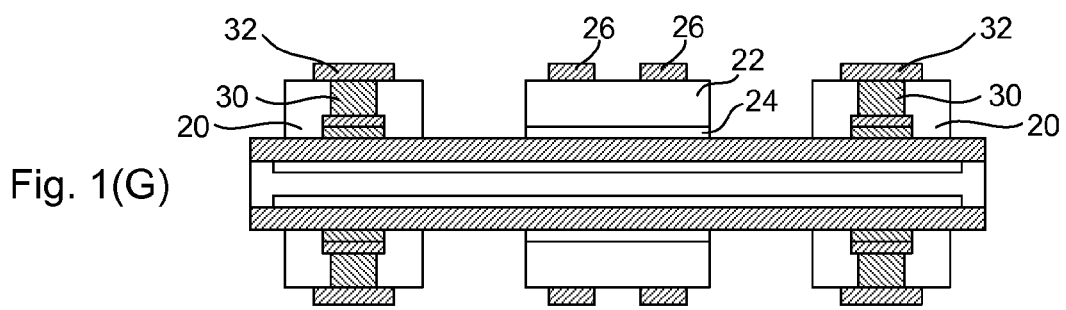

FIG. 1(G) illustrates the filling of the openings 28 with an electrically conductive material including, but not limited to, a metal. One example of a suitable material is Cu, which may be deposited into the POP via openings 28 using any suitable process, including, but not limited to, a combination of electroless deposition followed by dry film resist (DFR) patterning, followed by electroplating and DFR stripping and flash Cu seed etching. The resultant structure includes electrically conductive POP vias 30 with top landing pads 32 extending on a surface of the dielectric regions 20. If desired, the top landing pads 32 may be formed in a separate operation from the formation of the electrically conductive POP vias 30. In certain embodiments the landing pads 32 may be omitted.

In certain embodiments, the mounting of the die 22 (FIG. 1(E)), may be carried out prior to the formation of the POP via openings 28. In other embodiments, the mounting of the die may be carried out after the formation of the POP via openings 28.

As will be explained in more detail below in connection with FIG. 2, stacks of vias through dielectric material (including one or more embedded dielectric regions) to reach the POP pads 16 may be utilized in certain embodiments, for example, to accommodate a thicker die and/or additional routing.

Figure 1H:
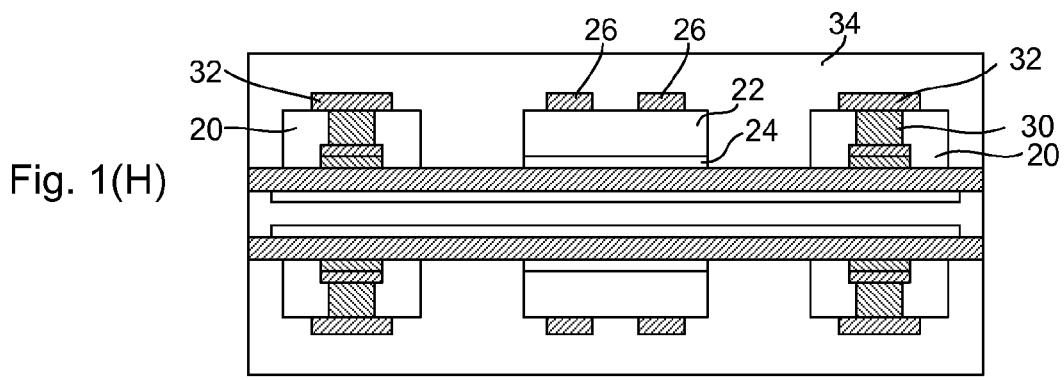
Figure 1I:
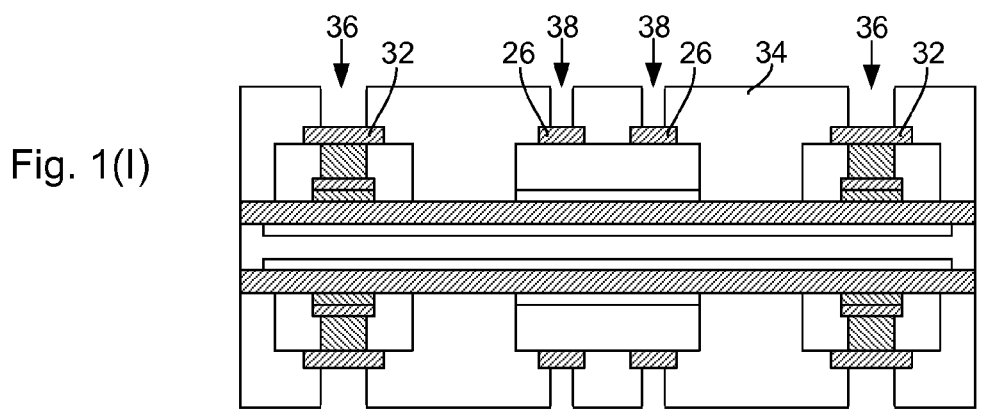
Figure 1J:
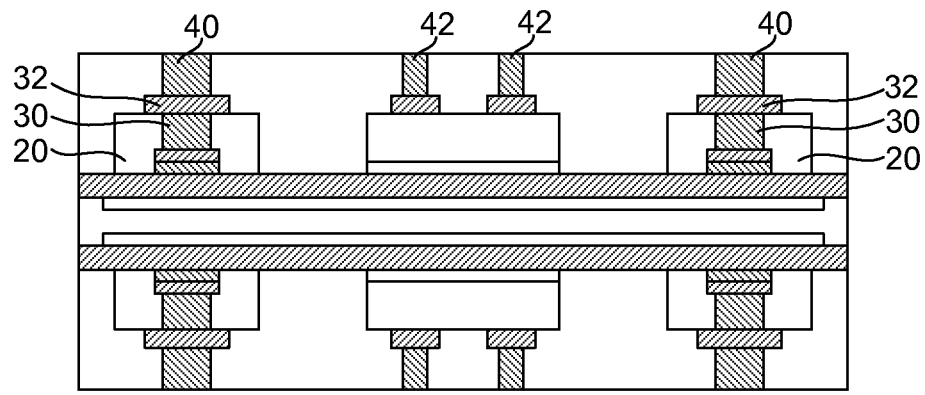

As illustrated in FIG. 1(H), additional dielectric layer 34 is formed on the dielectric regions 20, the landing pads 32 on the filled POP vias 30, the die 22 and die pads 26, and on the long Cu foil 14. The additional dielectric layer 34 may be any suitable dielectric material, including, but not limited to, ABF with a filler therein, that is laminated to the assembly. The resultant structure includes the dielectric regions 20 embedded within the additional dielectric layer 34. As illustrated in FIG. 1(I), openings are formed in the additional dielectric material layer 34 to form additional POP vias 36 that contact the POP via pads 32. Openings 38 are also formed in the additional dielectric layer 34 that contact the pads 26 on the die 22. The openings 36, 38 may be formed using any suitable process, including, but not limited to, laser drilling. In certain embodiments, the additional POP via openings 36 and the openings 38 that contact the die pads 26 may be formed in the same operation. In other embodiments the openings 36 and the openings 38 may be formed in separate operations. Electrically conductive material such as one or more metals may be positioned in the openings 36, 38 using, for example, patterning and plating operations as discussed above, to form electrically conductive vias 40 and 42, as illustrated in FIG. 1(J).

Figure 1K:
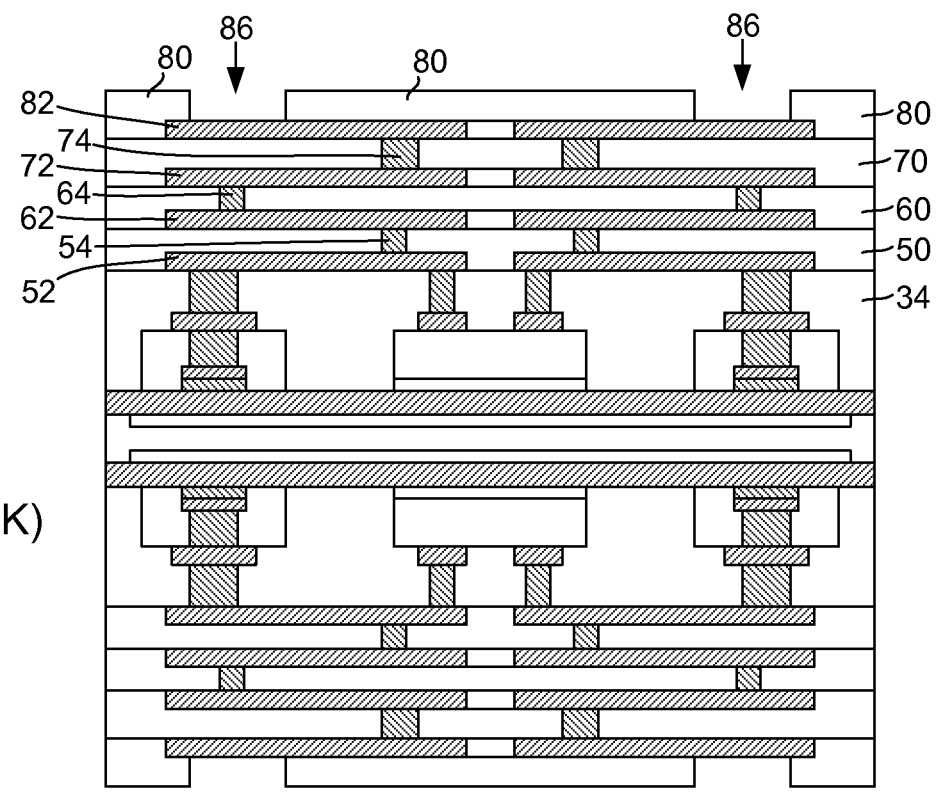

Additional BBUL layers may be formed, including, for example, dielectric layers 50, 60, 70, metal layers 52, 62, 72, 82 and electrically conductive vias 54, 64, 74 between the metal layers 52, 62, 72, 82 as illustrated in FIG. 1(K). Surface layer 80 may also be formed and includes openings 86 to expose pad regions on metal layer 82 on the land side of the structure that may be used for forming electrical interconnections to another structure such as, for example, a printed circuit board. The surface layer 80 may be a material such as a solder resist material having openings patterned therein for subsequent attachment to another structure using, for example, a ball grid array (BGA) configuration.

Assemblies may be detached from the short Cu foil 12 on the prepreg material 10 to form individual packages. The sacrificial long Cu foil 14 may be removed, using any suitable process, including, but not limited to etching, leaving a package structure 2 such as illustrated in FIG. 1(L), which illustrates one assembly flipped from the view of FIG. 1(K), including the die side 3 and land side 5.

FIG. 1(M) illustrates the coupling of another component such as a die 90 to the die 22. The die bonding film 24 has been removed and the die 90 positioned on the die 22. The die bonding film may be removed using any suitable method, including, but not limited to, dry (plasma) etching or wet etching. Any suitable method for coupling the die 90 to the die 22 may be utilized, including, but not limited to, the use of solder bumps 92 coupled to pads on the die 90 and on the die 22. Any type of suitable die 90 may be coupled to the die 22. In certain embodiments, the die 90 may be a memory and/or logic die and the die 22 may be a central processing unit (CPU).

FIG. 1(N) illustrates the package 2 illustrated in FIG. 1(L), with certain additional features that may be present in certain embodiments. The die 22 as illustrated in FIG. 1(N) includes a plurality of through-silicon vias (TSVs) 94 positioned therein. The TSV's 94 may extend through the thickness of the semiconductor die 22. In addition, electrical connections on the land side 5 to another structure such as a printed circuit board (PCB) may be made using any suitable structure and method, including, but not limited to, the use of solder bumps 96 and a reflow method to couple the solder bumps to the PCB.

Assembly structures such as those described above may enable a BBUL fully embedded and high aspect ratio POP architecture through the use of the stacked POP vias, including the electrically conductive POP vias 30 that are formed in the embedded dielectric regions 20, and the electrically conductive POP vias 40 that extend to the landing pads 32 on the embedded dielectric regions 20. In certain embodiments, the landing pads 32 are optional and in such structures, the electrically conductive POP vias 30 and 40 are in direct communication with one another.

Numerous modifications to the package structure and its formation as described above are possible. For example, the die may have a thickness that requires a greater number of stacked POP vias in order to make a reliable structure. In addition, for design flexibility, it may be useful to be able to reroute signals within the height ("the z-plane") of the embedded die, to provide added margin and design flexibility. This may be accomplished by controlling the patterning of the POP via landing pad layer to form suitable redistribution layer (RDL) regions within the z-plane of the die. FIG. 2 illustrates features including forming additional embedded dielectric regions to form additional POP vias, and forming RDL regions including pathways that electrically couple the additional POP vias to the POP vias within the package structure, in accordance with certain embodiments.

Figure 2:
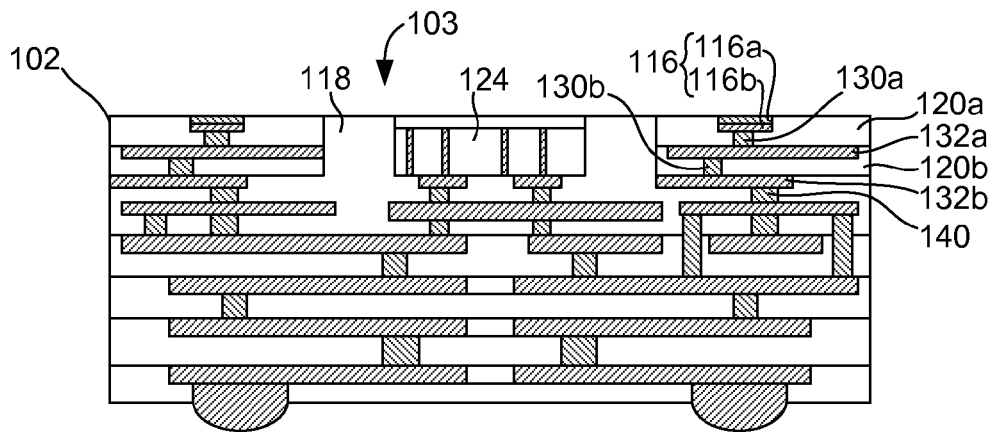
FIG. 2 illustrates a cross-sectional view of an assembly including an embedded die and POP vias in an embedded dielectric region, in accordance with certain embodiments.

FIG. 2 illustrates a package 102 having a structure in some ways similar to the package 2 described above in connection with FIG. 1(N), but with certain differences including the presence of stacked embedded dielectric regions 120a, 120b having electrically conductive vias 130a, 130b therein and including differences in the routing structure both within the stacked embedded dielectric regions 120a, 120b and in other layers of the package 102.

The stacked embedded dielectric regions 120a, 120b in dielectric layer 118 may be utilized when the die 124 has a thickness (height) that is relatively large. As a result, stacked embedded POP dielectric regions 120a, 120b, with electrically conductive vias 130a, 130b are utilized. Each of the vias 130a, 130b is of suitable aspect ratio to enable reliable formation. Additional vertical height (depending on the height of the die 124) may be accommodated by forming additional stacked embedded POP dielectric regions and vias.

FIG. 2 also illustrates the formation of RDL regions including the layer 132a that also acts as a landing pad for POP via 130a. The RDL layers 132a, 132b are regions that can be used to direct (or redistribute) the electrical path to coupled to other devices in or on the substrate and may be able to provide sufficient routing so that one or more layers of dielectric and metal that would otherwise be needed below the die level can be redistributed to the routing pathways in the RDL regions. Layer 132b is positioned to act as a landing pad for the additional POP via 130b and also is an RDL layer such as described above. As illustrated in FIG. 2, the vias 130a, 130b may be formed to be offset from one another. In other embodiments such vias may be in alignment with one another. The electrical path through the vias 130a, 130b extends to the die side 103 at pads 116 (which may include surface finish pad layer 116a and underlying pad layer 116b).

Figure 3:
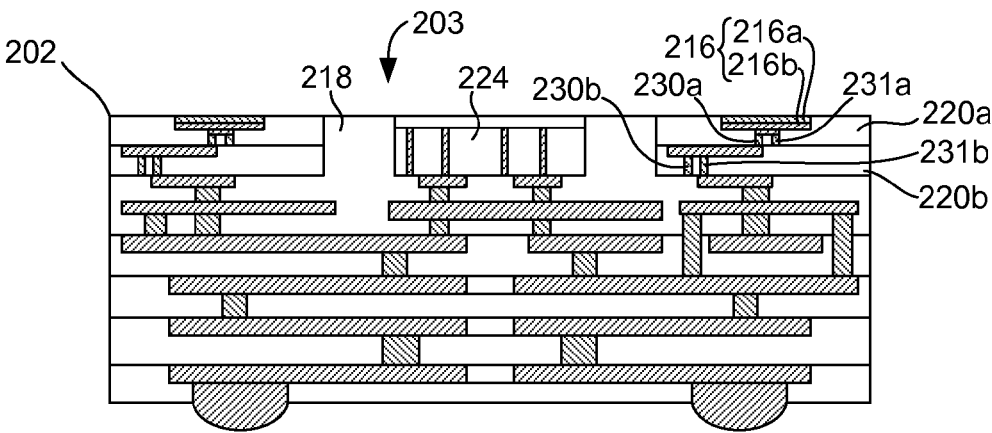
FIG. 3 illustrates a cross-sectional view of an assembly including an embedded die and POP vias in an embedded dielectric region, in accordance with certain embodiments.

FIG. 3 illustrates a package 202 having structure in some ways similar to the embodiment illustrated in FIG. 2, including the presence of stacked embedded dielectric regions 220a, 220b within dielectric layer 218. The package 202 includes liner type vias 230a, 231a located in the embedded dielectric region 220a, and with liner type vias, 230b, 231b located in the embedded dielectric region 220b. The liner vias 230a, 231a in embedded dielectric region 220a and the liner vias 230b, 231b in embedded dielectric region 220b may be offset from each other (staggered in formation) as illustrated in FIG. 3 and may be formed in connection with an RDL structure. In other embodiments such vias may be in alignment with each other. The electrical path through the vias 230a, 230b, 231a, 231b extends to the die side 203 at pads 216 (which may include surface finish pad layer 216a and underlying pad layer 216b).

Figure 4:
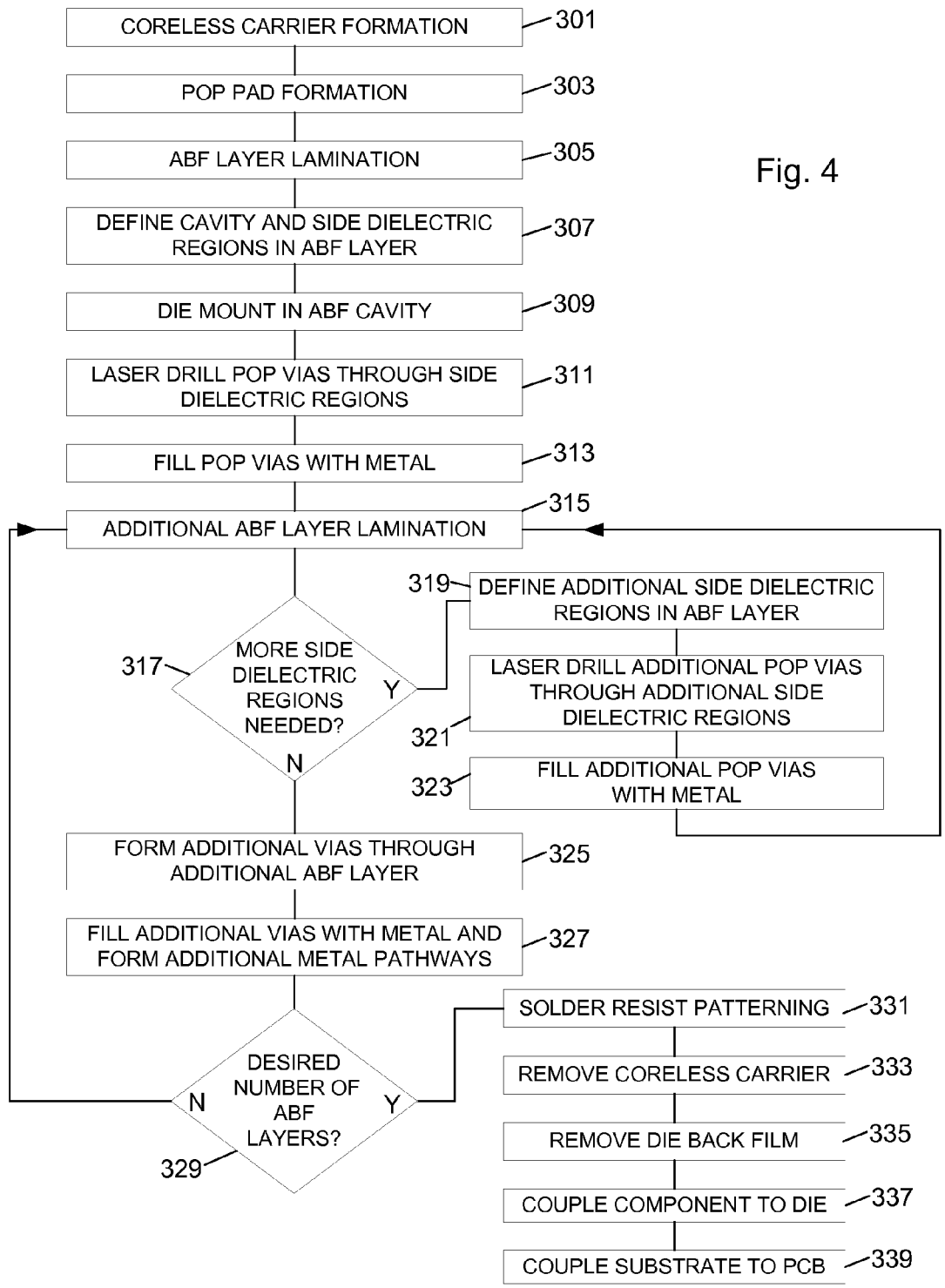
FIG. 4 illustrates a flow chart of process operations for forming an assembly, in accordance with certain embodiments.

FIG. 4 illustrates a flowchart of operations for forming an assembly including an embedded die with embedded dielectric regions having POP vias therein, in accordance with certain embodiments. Box 301 includes the formation of a coreless carrier using, for example, a core such as a prepreg material and metal layers such as short Cu and long Cu foils, as described above. Box 303 is forming spaced apart POP pads on a metal layer. The POP pads may be formed from a plurality of sub layers. Box 305 is forming a dielectric layer such as a laminated ABF layer on the metal layer and on the POP pads. Box 307 is defining a die cavity in the dielectric layer and side dielectric regions (to the sides of the die cavity) through which POP vias will be formed. The cavity may expose the metal layer. Box 309 is positioning a die in the cavity in the ABF layer. A die bonding film layer may be positioned between the die and the metal layer. Box 311 is forming POP vias through the side dielectric regions using, for example, laser drilling. Box 313 is filling the POP vias with an electrically conductive material including, for example, plated Cu. Landing pads may also be formed on the filled POP vias. Box 315 is the formation of an additional dielectric layer such as a laminated ABF layer. Box 317 is deciding whether additional side dielectric regions are needed. For example, in the case of a relatively thick die mounted in the cavity, the use of additional side dielectric regions enables the formation of additional POP vias coupled to the earlier formed POP vias. The use of stacked POP vias enables smaller aspect ratio vias to be used. In the absence of stacked vias, individual taller POP vias having a high aspect ratio would have to be used, and such high aspect ratio vias have proven difficult to properly fill with metal. As a result, the use of stacked POP vias extending through the side dielectric regions enables the formation of high quality filled POP vias and also enables relatively thick die structures to be embedded in a substrate.

Box 317 is deciding if additional side dielectric regions are needed. If yes, additional side dielectric regions (and thus additional POP vias) are needed, then Box 319 is defining additional side dielectric regions in the additional ABF layer. Box 321 is laser drilling additional POP vias through the additional side dielectric regions. Box 323 is filling the additional POP vias with metal and forming an electrical connection to the underlying POP vias. Then the method returns to Box 315 for additional dielectric layer (for example, ABF) formation. Again, box 317 is deciding whether additional side dielectric regions are needed. If yes, go back to Box 315. If no, additional side dielectric regions are not needed, then Box 325 is forming additional vias through the additional dielectric layer and Box 327 is filling the vias with metal and forming additional metal pathways for electrical interconnections. Box 329 is deciding if a desired number of layers have been formed in the substrate. If no, the process goes back to Box 315 for additional dielectric layer formation. Such layers may be formed using a BBUL process. If the desired number of layers is present, the Box 331 is forming a patterned photoresist layer on an outermost layer, with openings for forming land side connections such as, for example, a ball grid array (BGA). Box 333 is removing the coreless carrier. Box 335 is removing the die back film to expose a surface of the die for coupling to another component. Box 337 is coupling another component to the die using, for example, a solder bump connection. Box 339 is coupling the assembly, including the substrate having the embedded die and the component coupled thereto, to another structure such as a PCB on the land side of the substrate.

It should be appreciated that various additions, subtraction, and/or modifications may be made to the above operations described in connection with FIG. 4, within the scope of various embodiments. For example, the operation of Box 311 may be carried out prior to the operation of Box 309. In another example, if stacked side dielectric regions are formed (and stacked POP vias), then in certain embodiments the die mounting operation may take place after the formation of the stacked side dielectric regions. In another example, a plurality of die cavities may be formed and a plurality of die structures positioned within a substrate. In addition, certain embodiments may relate to a subset of the operations specified in FIG. 4, independent of other operations specified in FIG. 4.

Embodiments as described herein may provide one or more of the following advantages. First, the ability to create a high aspect ratio POP via (for example, greater than a 2:1 aspect ratio) using stacked smaller vias enables a BBUL fully embedded architecture for use with various thicknesses of embedded die structures. For example, as illustrated in FIG. 1(L), a high aspect ratio POP via structure includes the stacked filled vias 30, 40, with filled via 30 positioned in side dielectric regions 20 that are embedded within dielectric region 34, and filled vias 40 positioned in the dielectric region 34 over the filled vias 30 (and optional landing pads 32). Second, due to the smaller aspect ratio of each via, fully filled vias may be formed instead of liner plated vias, which provides better performance for high power and high bandwidth signals. Third, in certain embodiments, in addition to or instead of POP via pads, embedded die-level micropads may be formed on the die side surface in the embedded dielectric regions. Such micropads are generally smaller than POP pads and may be used, for example, for certain electrical testing procedures.

Fourth, the formation of the embedded dielectric regions (such as the embedded side dielectric regions 20 in the dielectric layer 34) enables the formation of a flatter surface, with less thickness variation across the substrate structure. Fifth, additional embedded dielectric regions such as the embedded side dielectric regions 20 may also be formed in locations where not vias are needed, to provide further thickness control using pre-designed volume displacement by forming embedded dielectric dummy regions. Sixth, the use of the embedded side dielectric regions provides improved design margins and flexibility in rerouting signals within the z-plane (height) of the die thickness, due to the ability for stacked POP vias that are offset from one another and electrically coupled using a landing pad, for example, as illustrated in FIG. 2, which illustrate landing pad layer or redistribution layer (RDL) 132a that electrically coupled vias 130a and 130b. In addition, it may be possible to reduce the overall height of the substrate by routing signals within RDL traces formed in connection with the embedded dielectric regions within the height of the die.

Assemblies including components formed as described in embodiments above may find application in a variety of electronic components. FIG. 5 schematically illustrates one example of an electronic system environment in which aspects of described embodiments may be embodied. Other embodiments need not include all of the features specified in FIG. 4, and may include alternative features not specified in FIG. 5.

The system 401 of FIG. 5 may include an integrated circuit package substrate 402 having a component such as a substrate 421 positioned thereon. The substrate 421 may be any suitable substrate including, but not limited to, a package substrate containing one or more die structures, or an interposer to which a package substrate or other structure may be coupled. As illustrated in FIG. 5, a portion of the substrate 421 is cut away to illustrate an embedded dielectric region 420 (indicated by hatched lines) and a die 490 positioned on the die side of the package substrate 421. The package substrate 402 includes an embedded die (not shown in FIG. 5), on which the die 490 is positioned and electrically coupled thereto. The structure may in some ways be similar to the structure of FIG. 1(M), which illustrates embedded die 24 and additional die 90 positioned thereon. In the embodiment illustrated in FIG. 5, a plurality of pads are positioned within the embedded dielectric region 420, the pads including, but not limited to, POP pads to which the package substrate 421 is coupled. As illustrated, the embedded dielectric region defines a region in the substrate 402 that extends around the embedded die on which the die 490 is positioned. The embedded die in the substrate 402 may be, for example, a CPU/microprocessor. The die 490 may comprise any suitable component die structure, including, but not limited to, memory, CPU/microprocessor, chipset, graphics device, wireless device, or other component. The substrate 402 may be coupled to a printed circuit board 407, which in this embodiment, may be a motherboard. Depending on what components are included in or on the substrate 402, a variety of other system components, including, but not limited to memory and other components discussed below, may also include structures formed in accordance with the embodiments described above.

In addition to the components included in or on the substrate 402, the system 401 may further include memory 409 and one or more controllers 411a, 411b . . . 411n, which are also disposed on the motherboard 407. The motherboard 407 may be a single layer or multi-layered board which has a plurality of conductive lines that provide communication between the circuits in the substrate 402 and other components mounted to the board 407. Programs and data in memory 409 may be swapped into storage 413 as part of memory management operations. One or more of the various components may alternatively be disposed on other cards such as daughter cards or expansion cards. Various components may be seated in individual sockets or may be connected directly to a printed circuit board. A display 415 may also be included.

The system 401 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant), smartphone or other telephony device (wireless or wired), network appliance, virtualization device, storage controller, network controller, router, etc.

The controllers 411a, 411b . . . 411n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 413 in accordance with a storage protocol layer. The storage protocol of the layer may be any of a number of known storage protocols. Data being written to or read from the storage 413 may be cached in accordance with known caching techniques. A network controller can include one or more protocol layers to send and receive network packets to and from remote devices over a network 417. The network 417 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

In addition, terms such as "first", "second", and the like, if used herein do not necessarily denote any particular order, quantity, or importance, but are used to distinguish one element from another. Terms such as "top", "bottom", "upper", "lower", "uppermost", "lowermost", and the like, if used herein, are used for descriptive purposes and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

What is claimed is:

1. An assembly comprising:
    a die embedded in a dielectric layer in a multilayer substrate;
    a dielectric region embedded in the dielectric layer in the multilayer substrate;
    the multilayer substrate including a die side and a land side, the dielectric region and the dielectric layer extending to the die side;
    a plurality of pads on the die side; and
    a plurality of electrically conductive pathways extending through the dielectric region, the plurality of electrically conductive pathways extending to the plurality of pads on the die side.

2. The assembly of claim 1, further comprising a plurality of electrically conductive pathways extending through the dielectric layer that are electrically coupled to the plurality of electrically conductive pathways extending through the dielectric region.

3. The assembly of claim 1, wherein the die embedded in the dielectric region is a first die, the assembly further comprising an additional die positioned on the die on the die side of the multilayer substrate.

4. The assembly of claim 3, further comprising a substrate coupled to the plurality of pads, wherein the substrate extends over the second die.

5. The assembly of claim 1, further comprising a substrate coupled to the plurality of pads.

6. The assembly of claim 1, wherein the dielectric region embedded in the dielectric layer is a first dielectric region, the assembly further comprising a second dielectric region embedded in the dielectric layer, the second dielectric region separated from the die side by the first dielectric region.

7. The assembly of claim 6, wherein the plurality of electrically conductive pathways extending through the first dielectric region are first electrically conductive pathways, wherein the second dielectric region includes a plurality of second electrically conductive pathways extending therethrough, wherein at least a portion of the plurality of second electrically conductive pathways are offset from at least a portion of the first electrically conductive pathways and electrically coupled thereto.

8. The assembly of claim 1, wherein the dielectric region extends around the die within the dielectric layer.

9. The assembly of claim 1, wherein the dielectric region comprises a plurality of spaced apart dielectric regions.

10. The assembly of claim 1, wherein the multilayer substrate comprises a coreless structure.

11. The assembly of claim 1, wherein the die comprises a silicon die including through-silicon vias.

12. An assembly comprising:
    a multilayer substrate including a land side and a die side;
    a first die embedded in a first dielectric layer of the multilayer substrate, the first dielectric layer separated from the land side by a plurality of additional dielectric layers;
    a first dielectric region embedded in the first dielectric layer;
    a plurality of pads on the die side;
    a plurality of first electrically conductive pathways in the first dielectric region, the plurality of first electrically conductive pathways electrically coupled to the plurality of pads on the die side;
    a second dielectric region embedded in the first dielectric layer; and
    a plurality of second electrically conductive pathways in the second dielectric region electrically coupled to the plurality of first electrically conductive pathways in the first dielectric region;
    wherein the first dielectric region is positioned between the second dielectric region and the die side.

13. The assembly of claim 12, further comprising a substrate coupled to the plurality of pads on the die side.

14. The assembly of claim 12, further comprising a second die coupled to the first die on the die side.

15. The assembly of claim 14, further comprising a substrate coupled to the plurality of pads on the die side, wherein the second die is positioned between the substrate and the die side.

* * * * *